United States Patent
Joffe et al.

(10) Patent No.: US 6,415,354 B1
(45) Date of Patent: Jul. 2, 2002

(54) PIPELINED METHODS AND APPARATUS FOR WEIGHT SELECTION AND CONTENT ADDRESSABLE MEMORY SEARCHES

(75) Inventors: Alexander Joffe, Palo Alto; Oran Uzrad-Nali, Sunnyvale; Simon H. Milner, Menlo Park, all of CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/354,684

(22) Filed: Jul. 15, 1999

(51) Int. Cl.[7] .......................... G06F 13/18; G06F 12/02; G06F 9/38

(52) U.S. Cl. .......................... 711/108; 712/23; 712/24; 712/245; 711/216; 711/169

(58) Field of Search .................................. 712/24, 28, 9, 712/3, 206, 29, 30, 412, 8, 218, 217, 214, 212, 23, 245, 219, 246, 247, 215, 235, 14, 15, 17, 25; 710/240, 107, 113, 132, 241; 711/108, 120, 206, 216, 117, 168; 341/51, 106; 365/49, 154, 189.07; 370/389; 703/79, 21; 702/186; 708/501, 205, 523; 705/7

(56) References Cited

U.S. PATENT DOCUMENTS

| | | | | |
|---|---|---|---|---|
| 5,414,704 A | * | 5/1995 | Spinney | 711/108 |
| 5,771,010 A | * | 6/1998 | Masenas | 341/51 |
| 5,842,025 A | | 11/1998 | Joffe | 395/728 |
| 5,999,435 A | * | 12/1999 | Henderson | 365/49 |

FOREIGN PATENT DOCUMENTS

WO    WO 98/41922    9/1998

OTHER PUBLICATIONS

Anthony J. McAuley et al., Fast Routing Table Lookup Using CAMs, IEEE INFOCOM '93, Conference on Computer Communications (1993), Proceedings, vol. 3, pp. 1382–1391.

S. Deering et al., Internet Protocol, Version 6 (IPv6) Specification, Network Working Group, (http://www.ietf.cnri.reston.va.us/rfc/rfc1883.txt), May 28, 1999, pp. 1–33.

Willibald Doeringer et al., Routing on Longest–Matching Prefixes, IEEE/ACM Transactions on Networking, vol. 4, No. 1, Feb. 1996, pp. 86–97.

Stefan Nilsson et al., Fast Address Lookup for Internet Routers, Broadband Communications, Fourth International Conference on Broadband Communications, 1998, pp. 11–22.

V. Srinivasan et al., Fast and Scalable Layer Four Switching, Computer Communication Review, ACM SIGCOMM '98 Proceedings, Oct. 1998, vol. 28, No. 4, pp. 191–202.

John McQuillan, Routers and Switches Converge, Data Communications, Oct. 21, 1997, pp. 120–124.

(List continued on next page.)

*Primary Examiner*—Daniel H. Pan
(74) *Attorney, Agent, or Firm*—Skjerven Morrill LLP; Michael Shenker

(57) ABSTRACT

When a search key is supplied to a content addressable memory (CAM), the CAM signals indicate which CAM entries have matched the key. These signals are provided to a weight array to select the entry of the highest priority. Each entry's priority is indicated by a weight in the weight array. The weight array processing is pipelined. In pipeline stage 0, the most significant bits (bits 0) of the weights are examined, and the highest priorities are selected based on the most significant bits. At pipeline stage 1, the next most significant bits (bits 1) are examined, and so on.

23 Claims, 3 Drawing Sheets

OTHER PUBLICATIONS

T.V. Lakshman et al., High–Speed Policy–based Packet Forwarding Using Efficient Multi–dimensional Range Matching, Computer Communication Review, ACM SIG-COMM '98 Proceedings, Oct. 1998, vol. 28, No. 4, pp. 203–214.

Marcel Waldvogel et al., Scalable High Speed IP Routing Lookups, Computer Communication Review, ACM SIG-COMM '97 Conference, Oct. 1997, vol. 27, No. 4, pp. 25–36.

V.P. Kumar et al., Beyond Best Effort: Router Architectures for the Differentiated Services of Tomorrow's Internet, http://www.bell–labs.com/user/stiliadi/router/router.html (and links referenced therein), May 1998, 33 pages.

Chuck Semeria et al., 3Com's Strategy for Delivering Differentiated Service Levels, 3Com Systems Marketing, Feb. 6, 1998, pp. 1–25.

MUSIC Semiconductors; Advance Information, MUAA™ Routing CoProcessor (RCP) Family, Oct. 1, 1998 Rev. 1b, pp. 1–16.

MUSIC Semiconductors; Application Note AN–N27, Using MUSIC Devices and RCPs for IP Flow Recognition, Oct. 21, 1998 Rev. 0, pp. 1–20.

MUSIC Semiconductors; Application Note AN–N31, Wide Ternary Searches Using MUSIC CAMs and RCPs, Apr. 13, 1999 Rev. 0, pp. 1–8.

MUSIC Semiconductors; Data Sheet, MU9C432OL ATM-CAM™, Oct. 1, 1998 Rev. 2a, pp. 1–32.

Ternary Synchronous Content Addressable Memory (IPCAM™) NL82721, NetLogic Microsystems, Inc., 1998, http://www.netlogicmicro.com/products/NL82721.html, pp. 1–3.

* cited by examiner

PIPELINED METHODS AND APPARATUS FOR WEIGHT SELECTION AND CONTENT ADDRESSABLE MEMORY SEARCHES

BACKGROUND OF THE INVENTION

The present invention relates to pipelined circuits, and more particularly to pipelined methods and apparatus for weight selection and content addressable memory searches.

Content addressable memories (CAMs) can be used in network routers to perform address translation, filtering, and quality of service (QoS) determination. See PCT Publication WO 98/41922, "Accelerated Hierarchical Address Filtering and Translation", Music Semiconductors, Inc., Sep. 24, 1998. See also A. J. McAuley and P. Francis, "Fast Routing Table Lookup Using CAMs", Proceedings of the Conference on Computer Communications, IEEE INFOCOM '93, pages 1382–1391. Address translation involves examining a packet destination address or connection identifier to determine the router port or ports on which the packet should be transmitted. Filtering involves examining source or destination addresses, or both, and possibly other information, to determine if the packet should be discarded. Determining the quality of service may involve examination of the source and/or destination addresses, and possibly other information, to determine delay parameters, loss priority, or other service parameters for the packet.

Today's primary application is address translation in network routers. QoS determination, however, is becoming increasingly important in each network element (e.g. each router), and has to be enforced end-to-end across the network. This is driven by the following paradigm shifts in network infrastructure requirements:

1. With the convergence of voice, video, and data onto a common network infrastructure, rigorous QoS guarantees have to be upheld for real-time applications.
2. Through e-commerce and mission-critical applications, high priority delivery has to be guaranteed.

When a packet arrives at a router, the source or destination address or other information in the packet is used to form a key for searching the CAM. If the key matches a CAM entry, the data corresponding to the entry provides the needed information such as the output port on which the packet should be transmitted, or a flag indicating whether or not the packet should be discarded, or a quality of service parameter.

A key can match several entries in the CAM. An entry may have "don't care" bits. For example, an entry may have the form "1101 1001 XX...X", where X means "don't care". Another CAM entry may have the form "1101 XXXX XX...X". If the first eight bits of the key are "1101 1001", the key will match both entries. Therefore, the best matching entry (the highest priority entry) has to be determined.

In some circuits, the entries' priorities are defined by the order of the entries in the CAM. The entries are ordered in the order of descending priorities. The first matching entry is the best match. A disadvantage of this scheme is that the entries have to be rearranged when an entry is added or deleted. Adding and deleting entries in routers can be a frequent occurrence as routers and communication links are put in and out of service.

Another approach is to allocate a separate block of memory for entries of each priority. Adding and deleting of entries becomes easier. However, memory use is inefficient. If a memory block allocated for some priority gets full, additional entries destined for the block cannot be placed in other blocks even if the other blocks have memory available.

Another solution is to store the priority of each entry explicitly. Only the entries of the highest priority are searched. If no matching entry is found, the entries of the next highest priority are searched, and so on. Disadvantageously, the CAM may have to be searched many times before the best match is determined.

The aforementioned PCT Publication WO 98/41922 describes a technique requiring only two CAM searches. In that technique, each priority has only one bit set (i.e., only one bit has a value 1). When the CAM is searched for the first time, the search is performed among all the entries. The priorities of the matching entries are ORed. The most significant bit of the result of the OR operation defines the highest priority for which a match has occurred. When the CAM is searched for the second time, the search covers only the entries of the highest priority determined from the OR operation.

Improvements on these techniques are desirable.

SUMMARY

According to the present invention, the priority of each CAM entry is stored explicitly, and is indicated by a number that we will call a "weight" of the CAM entry. Selection of the highest priority entry is pipelined. For example, the selection process includes "N" pipeline stages, where $N \geq 2$. We will call these pipeline stages "stage 0", "stage 1", and so on.

When the CAM has been searched, the pipeline stage 0 selects one or more of the weights based on one or more bits of each weight participating in the selection. Each pipeline stage i ($i \geq 1$) selects one or more of the weights from the weights selected at the pipeline stage i-1.

In some embodiments, pipeline stage 0 selects weights based on the most significant bit of each weight. Pipeline stage 1 selects weights based on the next most significant bit (e.g., bit "1" if the most significant bit is denoted bit "0"). If the pipeline stage 2 is present, it selects weights based on the next most significant bit (bit 2), and so on.

Since a pipeline stage performed for one key can overlap with other pipeline stages performed for other keys, high throughput is achievable.

In some embodiments, the CAM can be searched only once, so the CAM searches for different keys can be easily pipelined.

In some network applications the CAM of the present invention provides fixed single clock cycle search throughput, independent of the network loading or traffic characteristics. Some embodiments also provide fixed time single-entry insertion table updates (adding a single entry with its associated weight takes a fixed amount of time) because the entries do not have to be ordered in the CAM. High throughput (e.g. single clock cycle throughput) allows the QoS determination for each incoming packet to be performed before the packet is queued in the network element. Fixed time QoS packet processing before the first queuing point in the network element facilitates guaranteeing QoS levels to the end user.

The invention is not limited to the number of weight bits examined at each pipeline stage, the number of CAM searches per key, or even to CAM searches. For example, the pipelined weight selection techniques of the invention are used to arbitrate access to a shared resource. Each entity sharing the resource has a priority defined based on a corresponding weight. Pipelined weight selection is performed to select the highest priority entities requesting access to the resource.

Other features and advantages of the invention are described below. The invention is defined by the appended claims.

DESCRIPTION OF PREFERRED EMBODIMENTS

Figure 1:
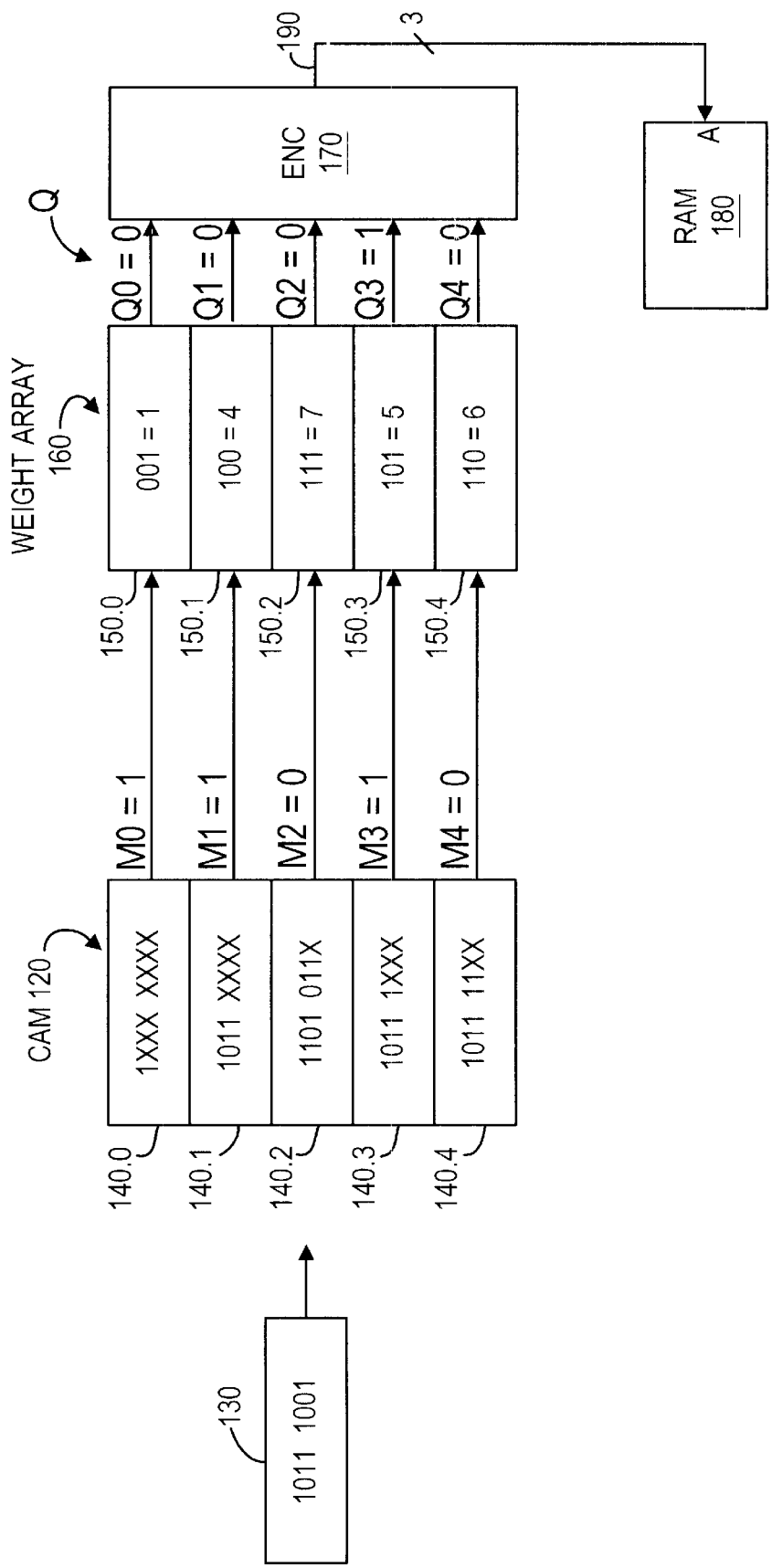
FIG. 1 is a block diagram of a CAM searching circuit according to the present invention.

FIG. 1 illustrates a pipelined CAM searching circuit. CAM 120 can be searched for a key 130. The key 130 can match more than one CAM entries 140.i (i=0, 1, . . . ). The best match is determined using weights 150.i (i=0, 1, . . . ) in weight array 160. The weight array output Q=Q0, Q1, . . . provides a new search result on every clock cycle. The search result Q identifies an index of the best matching entry in CAM 120 (for example, Qi=1 means that the entry 140.i is the best match). The signal Q can be encoded by encoder 170. The encoder output can be used as an address to a random access memory (RAM) 180. RAM 180 can store data associated with key 130. Examples of such data are a port or ports on which a packet with a destination address 130 should be transmitted, a connection identifier to be used by a switch or a router for packet processing, an output connection identifier to be inserted into the packet, a flag indicating whether or not the packet should be discarded, quality of service parameters, or a combination of all of the above.

FIG. 1 shows example values of entries 140, key 130, weights 150, and signal Q. For example, entry 140.0 has the value "1XXX XXXX". In the embodiment of FIG. 1, CAM 120 is a ternary CAM. Each entry 140 can include "don't care" bits "X" (also called non-significant bits) in any position. An entry can include only don't care bits, or only significant bits (0's and 1's), or any combination of don't care and significant bits.

In some embodiments, CAM 120 has a conventional construction. Each entry can be implemented as a combination of a binary entry (i.e., an entry having only 0's and 1's) and a mask. See the aforementioned PCT publication WO 98/41922 Sep. 24, 1998), and the aforementioned article by A. J. McAuley and P. Francis, "Fast Routing Table Lookup Using CAMs", IEEE INFOCOM Proceedings 1993, pages 1382–1391. Both of these publications are incorporated herein by reference. Other CAM implementations are possible, ternary and non-ternary, whether known or to be invented.

In FIG. 1, CAM 120 has five 8-bit entries. However, any other number of entries and any other number of bits in each entry are possible.

CAM 120 generates output signals M0, M1, etc. Each output Mi (i=0, 1, . . . ) indicates whether or not the key 130 has matched the corresponding entry 140.i (for the same "i"). In FIG. 1, Mi=1 indicates a match, and Mi=0 indicates no match. In other embodiments, other kinds of coding are possible (e.g., Mi=0 could mean a match, and Mi=1 could mean no match).

FIG. 1 shows example values of outputs Mi.

Signals Mi are provided to weight array 160. A weight array entry 150.i defines the priority of the corresponding CAM entry 140.i. FIG. 1 shows both the binary and the decimal value of each weight 150.i in one example. Some weight arrays store only the binary values. In FIG. 1, higher weights indicate higher priorities. In other embodiments, higher weights indicate lower priorities.

In the example of FIG. 1, each weight 150.i equals the number of the significant digits in the corresponding CAM entry 140.i. Thus, the longest matching CAM entry is selected. Such circuits are used for address translation in networks. Other embodiments define weights in other ways. The invention is not limited to any particular way to define the weights.

In the example of FIG. 1, the X bits are the trailing bits in each entry 140. This is common in IP (Internet Protocol) address translation applications. In some embodiments, the X bits can be in any position, not necessarily trailing or contiguous as in FIG. 1.

In FIG. 1, Qi=1 indicates the corresponding weight entry 150.i is selected as having the highest priority, Qi=0 indicates weight entry 150.i is not selected. Other embodiments use other coding (for example, the meaning of Qi=1 and Qi=0 can be reversed).

Weights 150 can be defined so that at most one output Qi will be 1 at any time. To accomplish this, entries that can match the same key are assigned different weights. Entries that cannot match the same key can be assigned the same weight to reduce the number of weights and hence the number of bits needed to store the weights. For example, entries "10XX XXXX" and "01XX XXXX" can be assigned the same weight. In FIG. 1, at most 5 matches are possible since the CAM has only 5 entries. Each weight 150 has 3 bits since 3 bits are sufficient to encode 5 different weights. Three bits can suffice even if the CAM has more than 5 entries and even more than 8 entries. For example, if the CAM is used for address prefix matching (all the X bits are trailing bits), and the longest address is 8 bits, then a key can match at most 8 entries (assuming the CAM does not have an entry in which every bit is an X bit). At most 8 matches are possible even if the CAM has more than 8 entries. It can be shown that 8 weight values (and hence 3 bits) are sufficient in this case to ensure at most one best match in any CAM search. If the longest address is m bits, a key can match at most m entries, so $\log_2 m$ bits (rounded up to the nearest integer) are sufficient for each weight. Thus, for 32-bit IP addresses (IP version 4), 5 bits are sufficient. For 128-bit IP addresses (IP version 6), 7 bits are sufficient.

Encoder 170 converts the value represented by outputs Qi (i=0, . . . ,4) to a 3-bit binary value $x_2 x_1 x_0 = x_2 * 4 + x_1 * 2 + x_0$ on 3-bit output 190. This value is provided to address terminals of RAM 180.

Figure 2:
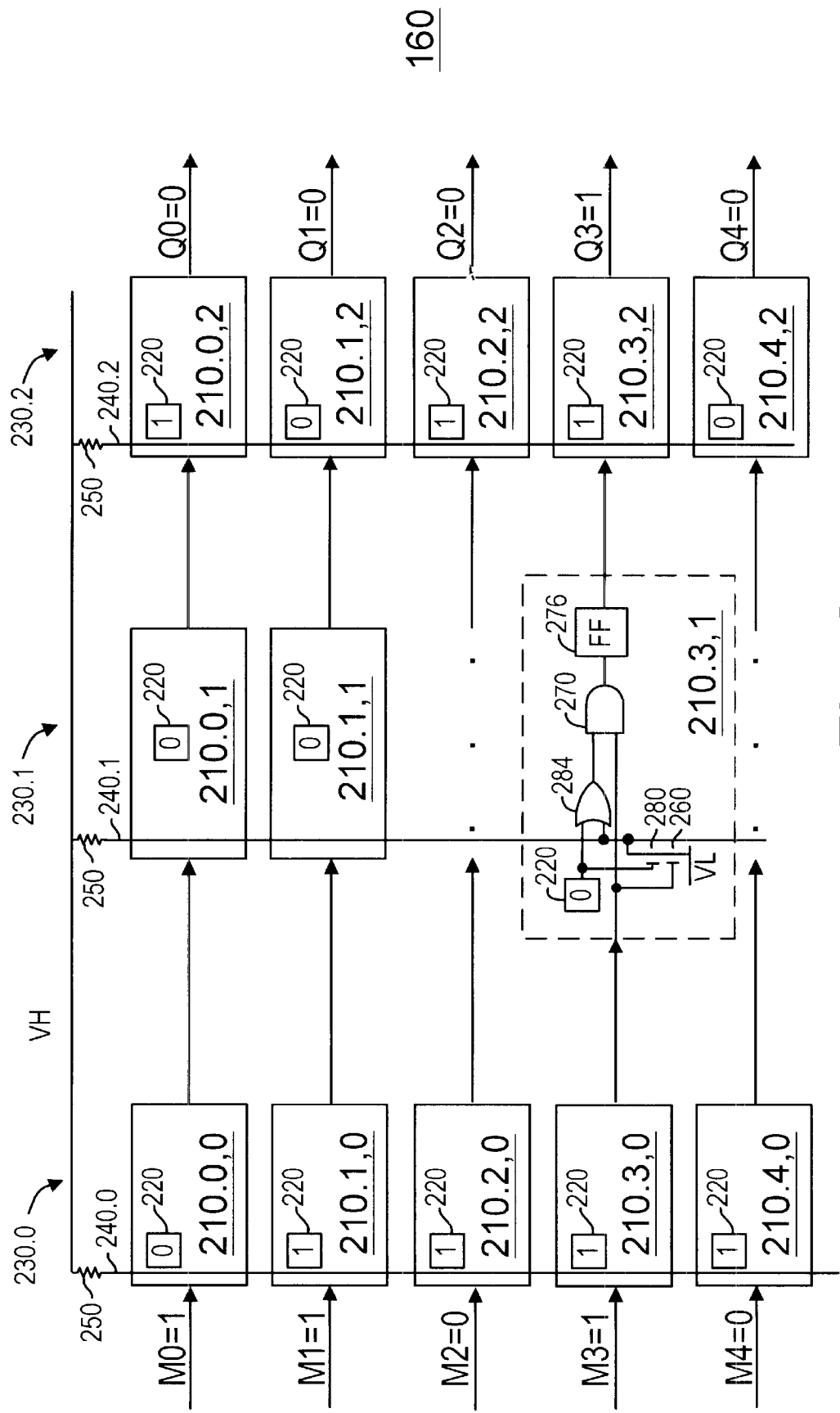
FIGS. 2 and 3 are block-circuit diagrams of weight arrays that can be used in the circuit of FIG. 1.

FIG. 2 is a block diagram of one embodiment of weight array 160. For given numbers "i" and "j", the bit in position "j" of weight 150.i is stored in a corresponding block 210.i,j. (Position "0" is the most significant. Position "2" is the least significant.) Each bit is stored in memory cell 220 of the corresponding block 210.i,j. Blocks 210 are arranged in the same order (left-to-right and top-down) as the corresponding weight bits in FIG. 1. Thus, bits at positions 0, 1, 2 in weight 150.0 (bit values 001) are stored in respective blocks 210.0, 0, 210.0,1, 210.0,2, in the first row in FIG. 2; the bits at positions 0, 1, 2 (the bit values 100) in weight 150.1 are stored in the second row; and so on. Other arrangements of blocks 210 are also possible.

All the blocks 210 are identical, and only block 210.3,1 is shown in detail. (The blocks do not have to be identical in other embodiments.)

Weight array 160 includes three pipeline stages 0, 1, 2. Each pipeline stage "j" is implemented by the respective column 230.j of blocks 210. Column 230.j includes the blocks 210.0,j, 210.1,j, 210.2,j, 210.3,j. We will sometimes refer to column 230.j simply as "column j".

In FIG. 2, each block 210.i,0 in column 0 has an input receiving a corresponding signal Mi. In the other columns j≠0, the input of each block 210.i,j is connected to the output of the corresponding block 210.i,j-1 in the same row i in the previous column. The outputs of blocks 210.i,2 of the last column are the outputs Qi.

At pipeline stage 0, the column 0 (blocks 210.i.0) selects the highest priority weights 150 from the weights for which Mi=1. The highest priority weights are selected based on the most significant weight bits (the bits stored in column 0). In each subsequent stage, the next column (column 1 or 2) selects the highest priority weights from the weights selected at the previous stage. At stage 1, the highest priority weights are selected based on the bits at position 1. At stage 2, the highest priority weights are selected based on the bits at position 2. More than three pipeline stages are provided if each weight 150 has more than three bits. At each stage, the highest priority weights are selected based on the next most significant bit relative to the previous stage.

At the end of each stage j, the output of block 210.i,j is "1" if the weight 150.i has been selected, and "0" if not. (This coding of the block's output is reversed in some other embodiments.)

Each pipeline stage takes one clock cycle of a common clock (not shown).

Weight array 160 operates as follows. Each column j is connected to a respective conductive "priority" bus line 240.j (j=0, 1, 2). Priority buses 240.j are connected to a high voltage source VH (e.g., 5V) through respective pull-up resistors 250. Each block 210.i,j operates as explained below in sections 1 and 2.

Section 1

In any clock cycle, if the input of block 210.i,j is 0, this means the weight entry 150.i has been deselected in a previous clock cycle by a previous column 230 (if j>0) or by the signal Mi=0. In this case, block 210.i,j does not affect the priority bus 240.j (the block's transistor 260 is off). Block 210.i,j drives its output to 0 at the end of the current clock cycle. (The 0 input of block 210.i,j will cause AND gate 270 to provide "0" to flip-flop 276. The "0" output of AND gate 270 is latched by flip-flop 276 at the end of the clock cycle. The flip-flop output is the output of block 210.i,j. Flip-flop 276 is an edge triggered flip-flop in some embodiments.)

Section 2

If the input of block 210.i,j is 1, operation depends on the weight bit in the block's memory cell 220.

Sub-Section 2A

If the bit in cell 220 is 1, the block pulls the bus 240.j low (through NMOS transistors 280, 260) to a low voltage VL (e.g. ground). Also, block 210.i,j provides "1" on its output at the end of the clock cycle. (OR gate 284 propagates the 1 bit from cell 220 to flip-flop 276 through AND gate 270).

Sub-Section 2B

If the bit in cell 220 is 0, the block does not affect the voltage on bus 240.j (transistor 280 is off). The block's output at the end of the clock cycle corresponds to the state of priority bus 240.j. (The voltage on the priority bus propagates to flip-flop 276 through OR gate 284 and AND gate 270). If the bus 240.j is low, this means another block 210.k,j in the same column "j" has pulled the bus 240.j low in this clock cycle (see sub-section 2A above). That block 210.k,j must have "1" in its cell 220 and "1" on its input. The output of block 210.i,j at the end of the clock cycle will be "0", deselecting the weight 150.i.

If the bus 240.j is high, this means all the weights 150 (if any) that may have been selected previously have "0" in the corresponding bit position "j". The output of block 210.i,j at the end of the clock cycle will be high, i.e. the weight 150.i will remain selected.

This completes Section 2.

The construction of each block 210 is as follows. The block input is connected to the gate of the block's NMOS transistor 260. The output of cell 220 is connected to the gate of NMOS transistor 280. The output is a high voltage if the cell stores "1", and a low voltage if the cell stores "0". Transistors 260 and 280 are connected in series between the respective line 240 and voltage VL. OR gate 284 ORs the output of cell 220 with the signal on line 240. AND gate 270 ANDs the output of gate 284 with the block's input.

In some embodiments, several weight arrays are cascaded to obtain larger weights from weight arrays with smaller weights. The inputs Mi of the first weight array are the outputs of CAM 120, as shown in FIG. 1. The outputs Qi of the first weight array are connected to the respective inputs Mi of the second weight array, the outputs Qi of the second weight array are connected to the respective inputs Mi of the third weight array (if the third weight array is present), and so on. The outputs Qi of the last weight array indicate the selected weight and can be connected to encoder 170.

In some embodiments, CAM 120 and weight array 160 are integrated in one integrated circuit. In some embodiments, encoder 170 and, possibly, RAM 180 are integrated in the same integrated circuit.

In some IP translation embodiments, CAM 120 contains 64K to 256K 32-bit entries. The invention is not limited to any particular number of CAM entries.

In some embodiments, the CAM outputs Mi are latched by the CAM to allow the CAM search for one key to overlap with weight array pipeline stage 0 for another key. In other embodiments, the outputs Mi are not latched by the CAM, and additional latches are provided between the CAM and the weight array 160 to latch the Mi outputs.

In some embodiments, resistors 250 are replaced with transistors or other pull-up circuits. In some embodiments, voltage VH is lower than VL; suitable modifications to the circuit of FIG. 2 are made using methods known in the art.

In some embodiments, relaxation clock cycles are inserted at the start of the pipeline stages to allow more time for the lines 240.j to be charged to the voltage VH at the start of each pipeline stage. Blocks 210 are disabled from changing the voltages on lines 240.j during the relaxation cycles.

In some embodiments, lower weights indicate higher priorities. In each pipeline stage "j", if the input of block 210.i,j is 1 (the weight 150.i has not been deselected), and the bit in the block's cell 220 is 0, the block pulls the respective line 240.j low. Otherwise, the block does not affect the line 240.j. At the end of the clock cycle, if the block's input is 0, the block provides 0 on its output. If the block's input is 1, and the block's cell 220 stores 0, the block provides 1 on its output. If the input is 1 and the cell stores 1, the output depends on the state of line 240.j. If the line is low, the output will be 0, deselecting the corresponding weight 150.i. If the line is high, the output will be 1.

Figure 3:
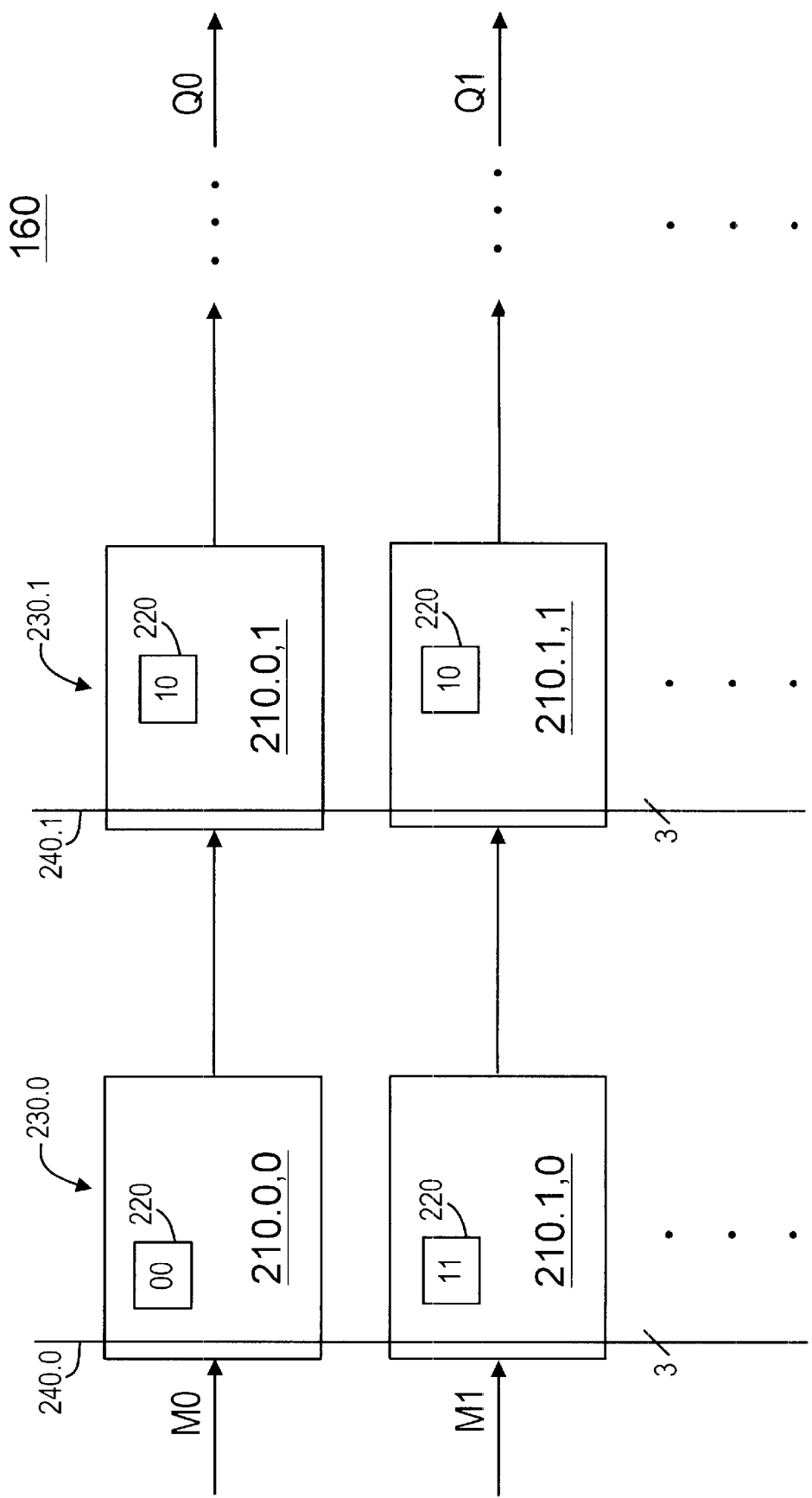

In FIG. 3, the number of pipeline stages can be reduced (halved) relative to the number of bits in each weight 150, and the number of clock cycles can also be reduced because each pipeline stage can take one clock cycle. In each pipeline stage "j", the weights are selected based on their two adjacent bits [2j:2j+1]. The bits [2j:2j+1] of weight 150.i are stored in memory cell 220 of block 210.i,j. Bus 240.j has three conductive lines 0, 1, 2, connected to a high voltage VH by pull-up resistors (not shown). The blocks 210.i,j of column "j" are connected to the lines 0, 1, 2 of bus 240.j by a wired-OR connection, as in FIG. 2. Thus, if at least one block 210.i,j drives line 0, 1 or 2 low, the line's voltage will be low (VL). If no block drives the line low, the line's voltage will be high (VH).

In FIG. 3, each weight 150.i has at least 4 bits. Lower weights indicate higher priorities.

In each clock cycle, if the input of block 210.i,j is 0 (weight 150.i has been deselected), the block will provide 0 on its output at the end of the clock cycle. If the block's input is 1, operation depends on the weight bits in the block's cell 220 as follows (see Table 1 below):

If the weight bits are 00, the block drives lines 0 and 1 of bus 240.j low, and does not affect line 2.

If the weight bits are 01 ("0" being the most significant of the two bits), the block drives line 0 low, and does not affect lines 1 and 2.

If the weight bits are 10, the block drives line 2 low, and does not affect lines 0 and 1.

If the weight bits are 11, the block does not affect lines 0, 1 and 2.

TABLE 1

Operation of Block 210.i,j

| Weight bits in cell 220 | Lines 0, 1, 2 ("0" means the line is driven low. "1" means the line is not affected by the block) |
|---|---|
| 00 | 001 |
| 01 | 011 |
| 10 | 110 |
| 11 | 111 |

At the end of the clock cycle, each block 210.i,j whose input is 1 sets its output according to the following Table 2 ("x" means "don't care"):

TABLE 2

| Line 0 of bus 240.j | Line 1 of bus 240.j | Line 2 of bus 240.j | Bits in cell 220 of block 210.i,j | Output of block 210.i,j |
|---|---|---|---|---|
| 0 | 0 | x | 00 | 1 |
| 0 | 0 | x | Not 00 | 0 |
| 0 | 1 | x | 01 | 1 |
| 0 | 1 | x | Not 01 | 0 |
| 1 | x | 0 | 10 | 1 |
| 1 | x | 0 | Not 10 | 0 |
| 1 | x | 1 |  | 1 |

Each pipeline stage can select weights based on more than two bits of a weight. In some embodiments, at pipeline stage "j", the weights are selected based on some number Kj (j=0, 1, ...) of adjacent bits of weight 150. The numbers $Kj \geq 1$, and they may be different for different "j". In each column "j", the corresponding bus 240.j has Cj conductive lines 0, 1, ..., Cj-1 (the numbers Cj may be different for different "j"). Blocks 210.i,j of column "j" are connected to the lines of bus 240.j by wired-OR connection, as in FIG. 2. In each clock cycle, each block 210.i,j of column "j" may drive selected lines of bus 240.j low according to the following Table 3 (in the example of FIG. 3, higher weights indicate lower priorities):

TABLE 3

| Decimal number formed by the Kj weight bits in cell 220 of block 210.i,j | Lines 0 through Cj-1 of bus 240.j. "0" means the respective line is driven low by block 210.i,j. "1" means the line is not affected by the block |
|---|---|
| 0 | 000 ... 000 |
| 1 | 100 ... 000 |
| 2 | 110 ... 000 |
| 3 | 111 ... 000 |
| ... | ... |
| $2^{Kj}-3$ | 111 ... 100 |
| $2^{Kj}-2$ | 111 ... 110 |
| $2^{Kj}-1$ | 111 ... 111 |

At the end of the clock cycle, the signals on bus 240.j select the highest priority weights 150.j among the weights selected previously. For example, if the priority lines 0, 1, ... Cj-1 are 000 ... 000 (all low), the weights are selected whose bits in cells 220 form the decimal number 0; if the priority lines are 100 ... 000, the weights are selected whose bits in cells 220 form thee decimal number 1; and so on, according to Table 3.

In some embodiments, multiple pipeline stages are combined into a single stage, and adjacent columns 230.j use the same bus 240, as described above for the case Cj=1. Higher weights may indicate higher or lower priorities. Relaxation cycles may be inserted.

The CAM circuits of the present invention can be used in a wide range of network packet classification applications. Packet classification can be used for the purpose of address translation (e.g., packets can be classified based on their addresses for the purpose of determining how the packets should be transmitted), filtering, quality of service determination, or for any other purpose. Classification (including address translation, filtering, and quality of service determination) can also be performed in non-packet networks, for example, in telephone networks. Telephone numbers can be used as addresses. Non-network CAM searching applications are also possible.

The invention is not limited to the embodiments described above. For example, in weight arrays 160, the output of a block 210.i,j can be connected to the input of block 210.i,j+1 through buffers, one or more inverters, or other elements, and not directly as in FIGS. 2 and 3. The same is true for connections between the outputs of CAM 120 and the inputs of weight array 160. Different columns 230 of the same weight array 160 can have different circuitry and different numbers of lines 240. The invention is not limited to any specific voltage values. The output Q of weight array 160 may indicate no selected entries (all the signals Qi are 0) or more than one entries. Other embodiments and variations are within the scope of the invention, as defined by the appended claims.

What is claimed is:

1. A method for selecting weights, each weight having a plurality of bits, the method comprising N pipeline stages 0, 1, ..., wherein N is an integer greater than or equal to 2, and wherein:

the pipeline stage 0 comprises selecting zero or more of the weights based on the $0^{th}$ bits of each weight participating in selection;

each pipeline stage j ($j \geq 1$) comprises selecting zero or more of the weights from the weights selected at the pipeline stage j-1, wherein the weights are selected based on the $j^{th}$ bit of each weight selected at the pipeline stage j-1;

wherein each pipeline stage is implemented by a circuit, all of said circuits are identical, and the operation of each circuit for one set of weights participating in the selection at the pipeline stage 0 is capable of overlapping with the operation of any other circuit for another set of weights participating in the selection at the pipeline stage 0.

2. The method of claim 1 further comprising receiving a signal indicating which weights participate in the selection at the pipeline stage 0.

3. The method of claim 1 further comprising:
   searching a content addressable memory (CAM) for a key, and determining zero, one, or more than one matching entries in the CAM, wherein each of the matching entries matches the key;
wherein each of the matching entries has a priority defined based on a corresponding one of said weights; and
the pipeline stages generate a signal indicating which of the matching entries have the highest priority.

4. An apparatus comprising:
   a storage for storing weights, each weight having a plurality of bits; and
   a pipelined circuit comprising N pipeline stages 0, 1, ..., wherein N is an integer greater than or equal to 2;
wherein the pipeline stage 0 is for selecting zero or more of the weights based on the $0^{th}$ bit of each weight participating in selection; and
wherein each pipeline stage j (j≧1) is for selecting zero or more of the weights from the weights selected at the pipeline stage j-1, wherein the weights are selected based on the $j^{th}$ bit of each weight selected at the pipeline stage j-1;
wherein each pipeline stage is implemented by a circuit, all of said circuits are identical, and the operation of each circuit for one set of weights participating in the selection at the pipeline stage 0 is capable of overlapping with the operation of any other circuit for another set of weights participating in the selection at the pipeline stage 0.

5. The apparatus of claim 4 further comprising a terminal for receiving a signal indicating which weights participate in the selection at the pipeline stage 0.

6. The apparatus of claim 4 further comprising a content addressable memory (CAM) operable to provide a signal indicating zero, one, or more than one entries in the CAM which have matched a key;
   wherein each of the matching entries has a priority defined based on a corresponding one of said weights; and
   the pipeline stages are to generate a signal indicating which of the matching entries have the highest priority.

7. A method for searching data in a content addressable memory (CAM) having a plurality of entries, wherein depending on values stored in the CAM a search key is capable of matching more than one CAM entries, wherein a plurality of weights are provided, each weight determining a priority of a corresponding entry in the CAM, the method comprising:
   (a) providing a key to the CAM, and determining zero, one, or more than one entries each of which matches the key;
   (b) determining highest priority entries among the entries found in (a), wherein the highest priority entries are determined based on the most significant bit of each weight; and
   (c) determining highest priority entries among the entries found in (b), wherein the highest priority entries are determined based on the next most significant bit of each weight;

wherein the operations (b) and (c) are pipelined, so that the operation (c) performed for one key is capable of overlapping with the operation (b) performed for one or more other keys;
wherein the operation (b) is performed by a circuit identical to a circuit performing the operation (c).

8. The method of claim 7 further comprising repeating the operation (c) one or more times for each key, wherein in each instance of the operation (c) the highest priority entries are determined based on the next most significant bit of each weight, and wherein the operation (c) is performed until all of the bits of at least one weight are exhausted, and wherein each instance of the operation (c) is pipelined so that each instance of the operation (c) for any one key is capable of overlapping with any other instance of the operation (c) for another key:
   wherein each instance of the operation (c) is performed by a separate circuit identical to the circuit performing the operation (b).

9. An apparatus comprising:
   a content addressable memory (CAM) having a plurality of entries, wherein depending on values stored in the CAM a search key is capable of matching more than one CAM entries;
   a storage for storing a plurality of weights, each weight determining a priority of a corresponding entry in the CAM;
   a first circuit for determining highest priority entries matching a search key, wherein the highest priority entries are to be determined based on the most significant bit of each weight; and
   a second circuit for determining highest priority entries among the entries found by the first circuit, wherein the highest priority entries are determined based on the next most significant bit of each weight;
wherein the first and second circuits are in different pipeline stages, so that the second circuit is operable for operating on one key while the first circuit operates on one or more other keys; and
the first and second circuits are identical.

10. A method for selecting one or more weights from a plurality of weights, each weight having at least N bits 0, 1, ..., wherein N is an integer greater than or equal to 2, the method comprising N pipeline stages 0, 1, ..., the method comprising:
   (1) at the pipeline stage 0:
      (1a) receiving, for each weight, a binary signal indicating whether or not the weight is to participate in the selection;
      (1b) receiving the bits 0 of the weights;
      (1c) selecting, from the weights which are to participate in the selection, zero or more weights based on the bits 0, and generating for each of the plurality of weights a binary signal indicating whether or not the corresponding weight has been selected at the pipeline stage 0;
   (2) at each pipeline stage j (j≧1):
      (2a) receiving, for each weight, a binary signal generated by the pipeline stage j-1 and indicating whether or not the weight has been selected at the pipeline stages 0 through j-1;
      (2b) receiving the bits j of the weights;
      (2c) selecting, from the weights which were selected at the pipeline stages 0 through j-1, zero or more weights based on the bits j, and generating for each of the plurality of weights a binary signal indicating whether or not the corresponding weight has been selected at the pipeline stages 0 through j;

wherein each pipelined stage 0 through N-1 performed for one set of the binary signals recited in paragraph 1a is operable to overlap with any other pipeline stage 0 through N-1 performed for another set of the binary signals recited in paragraph 1a.

11. The method of claim 10 wherein N≧3, wherein each pipeline stage j (j≧1) receives no signals generated by the other pipeline stages except for the binary signals recited in paragraph 2a, and each pipeline stage j (j≧0) receives no bits of any weights other than the bits j.

12. The method of claim 10 wherein each pipeline stage j (j≧0) selects the weights having the highest value of the bit j from the weights selected at the pipeline stage j-1 (if j>0) or from the weights selected by the binary signals recited in paragraph 1a (if j=0), the binary signals generated by the pipeline stage j thus selecting the highest weights based on the bits 0 through j.

13. The method of claim 10 wherein each pipeline stage j (j≧0) selects the weights having the lowest value of the bit j from the weights selected at the pipeline stage j-1 (if j>0) or from the weights selected by the binary signals recited in paragraph 1a (if j=0), the binary signals generated by the pipeline stage j thus selecting the lowest weights based on the bits 0 through j.

14. The method of claim 10 wherein each weight is associated with an entry in a content addressable memory (CAM), and the method further comprises:

searching the CAM for a key, and determining zero or more matching entries which match the key; and generating, for each entry, the binary signal recited in paragraph 1a, wherein for each matching entry the binary signal indicates that the corresponding weight is to participate in the selection, and for each non-matching entry the binary signal indicates that the corresponding weight is not to participate in the selection.

15. The method of claim 10 wherein the pipeline stages 0 through N-1 are implemented by identical circuits.

16. The method of claim 15 wherein each circuit implementing each pipeline stage j has a block for each weight, wherein each block is to receive the binary signal recited in paragraph 1a (if j=0) or 2a (if j>0), the binary signal corresponding to the weight, and wherein each block is to generate the binary signal indicating whether or not the weight is selected at the pipeline stage j;

wherein all of said blocks for all of the pipeline stages are identical.

17. An apparatus comprising:

a storage for storing a plurality of weights, each weight having at least N bits 0, 1, . . . ;

N circuits C.0, . . . C.N-1 for respective N pipeline stages 0, . . .N-1, wherein N is an integer greater than or equal to 2;

(1) wherein the circuit C.0 comprises:
   (1a) a terminal for receiving, for each weight, a binary signal indicating whether or not the weight is to participate in the selection; and
   (1b) a circuit for selecting, from the weights which are to participate in the selection, zero or more weights based on the bits 0 of the weights, and generating for each of the plurality of weights a binary signal indicating whether or not the corresponding weight has been selected at pipeline stage 0;

(2) wherein each circuit C.j (j≧1) comprises:
   (2a) a terminal for receiving for each weight, from the circuit C.j-1, a binary signal indicating whether or not the weight has been selected at the pipeline stages 0 through j-1; and
   (2b) a circuit for selecting, from the weights which were selected at the pipeline stages 0 through j-1, zero or more weights based on the bits j of the weights, and generating for each of the plurality of weights a binary signal indicating whether or not the corresponding weight has been selected at the pipeline stages 0 through j;

wherein each pipeline stage 0 through N-1 performed for one set of the binary signals recited in paragraph 1a is operable to overlap with any other pipeline stage 0 through N-1 performed for another set of the binary signals recited in paragraph 1a.

18. The apparatus of claim 17 wherein N≧3, wherein each circuit C.j (j≧1) receives no signals generated by the other circuits C.0, . . . C.N-1 except for the binary signals recited in paragraph 2a, and each circuit C.j (j≧0) receives no bits of any weights other than the bits j.

19. The apparatus of claim 17 wherein each circuit C.j selects the weights having the highest value of the bit j from the weights selected by the circuit C.j-1 (if j≧1) or from the weights selected by the binary signals recited in paragraph 1a (if j=0), the binary signals generated by the circuit C.j thus selecting the highest weights based on the bits 0 through j.

20. The apparatus of claim 17 wherein each circuit C.j selects the weights having the lowest value of the bit j from the weights selected by the circuit C.j-1 (if j≧1) or from the weights selected by the binary signals recited in paragraph 1a (if j=0), the binary signals generated by the circuit C.j thus selecting the lowest weights based on the bits 0 through j.

21. The apparatus of claim 17 further comprising a content addressable memory (CAM), wherein each weight is associated with an entry in the CAM, and the CAM comprises circuitry for searching the CAM for a key, and determining zero or more matching entries which match the key, and generating, for each entry, the binary signal recited in paragraph 1a, wherein for each matching entry the binary signal indicates that the corresponding weight is to participate in the selection, and for each non-matching entry the binary signal indicates that the corresponding weight is not to participate in the selection.

22. The apparatus of claim 17 wherein the circuits C.j (j=0, . . . N-1) are identical.

23. The apparatus of claim 22 wherein each circuit C.j (j=0, . . . N-1) comprises a block for each weight, wherein each block is to receive the binary signal recited in paragraph 1a (if j=0) or 2a (if j>0), the binary signal corresponding to the weight, and wherein each block is to generate the binary signal indicating whether or not the weight is selected at the pipeline stage j;

wherein all of said blocks for all of the circuits C.j are identical.

\* \* \* \* \*